US008766219B2

(12) United States Patent
Aliman et al.

(10) Patent No.: US 8,766,219 B2
(45) Date of Patent: Jul. 1, 2014

(54) PARTICLE BEAM MICROSCOPE FOR GENERATING MATERIAL DATA

(71) Applicant: Carl Zeiss Microscopy GmbH, Jena (DE)

(72) Inventors: Michel Aliman, Oberkochen (DE); Jaroslaw Paluszynski, Oberkochen (DE); Wolfgang Berger, Gerstetten (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/022,875

(22) Filed: Sep. 10, 2013

(65) Prior Publication Data
US 2014/0070099 A1 Mar. 13, 2014

(30) Foreign Application Priority Data
Sep. 11, 2012 (DE) .......................... 10 2012 017 950

(51) Int. Cl.
*H01J 37/28* (2006.01)
*H01J 37/26* (2006.01)
*A61N 5/06* (2006.01)
*A61N 5/00* (2006.01)

(52) U.S. Cl.
USPC .................. 250/492.3; 250/492.1; 250/492.2; 250/396 R; 250/494.1; 73/104

(58) Field of Classification Search
USPC .......... 250/306, 307, 309–311, 396 R, 492.1, 250/492.2, 492.21, 492.3, 494.1; 73/104, 73/105
See application file for complete search history.

(56) References Cited

U.S. PATENT DOCUMENTS

| | | | | |
|---|---|---|---|---|
| 3,740,608 A * | 6/1973 | Manber et al. | ................ | 315/367 |
| 4,835,385 A * | 5/1989 | Kato et al. | .................... | 250/310 |
| 4,912,313 A * | 3/1990 | Kato et al. | .................... | 250/307 |
| 5,825,670 A * | 10/1998 | Chernoff et al. | ................ | 702/85 |
| 6,238,830 B1 * | 5/2001 | Rangarajan et al. | ............ | 430/30 |
| 7,449,699 B1 * | 11/2008 | Adams et al. | ............... | 250/492.1 |
| 8,222,598 B2 * | 7/2012 | Statham et al. | ............... | 250/306 |
| 8,227,753 B2 * | 7/2012 | Notte et al. | .................... | 250/307 |
| 2011/0192973 A1 * | 8/2011 | Glasmachers et al. | ........ | 250/288 |
| 2011/0220788 A1 * | 9/2011 | Laue et al. | .................... | 250/288 |
| 2012/0074317 A1 * | 3/2012 | Diemer et al. | ................ | 250/307 |
| 2013/0340126 A1 * | 12/2013 | Proksch | .......................... | 850/33 |
| 2014/0042316 A1 * | 2/2014 | Barbi et al. | .................... | 250/307 |

OTHER PUBLICATIONS

Aliman et al.,"Enhanced Four Video-Outputs Backscattered Electron Detector (AsB4) Enabling Live 3D Sample Surface Modeling (3DSM) Even Under Very High Gain Conditions", Microscopy and Microanalysis, pp. 1-2, 2012.

(Continued)

*Primary Examiner* — Bernard E Souw
(74) *Attorney, Agent, or Firm* — Morris & Kamlay LLP (57) ABSTRACT

A method of operating a particle beam microscopy. A particle beam is scanned across a scanning region of a surface of the object. Particles are detected by a detector system for a plurality of impingement locations of the primary beam within the scanning region. A detector system generates detector signals which represent for each of the impingement locations an intensity of the detected particles. Material data of the interaction regions are calculated depending on the detector signals and depending on topography data, which represent a topography of the object surface in the scanning region.

23 Claims, 7 Drawing Sheets

(56) References Cited

OTHER PUBLICATIONS

Ball et al.,"The Measurement of Atomic Number and Composition in an SEM Using Backscattered Detectors", Journal of Microscopy, vol. 124, Pt. 1, pp. 57-68, 1981.

Campbell et al.,"Tunable Glass Reference Materials for Quantitative Backscattered Electron Imaging of Mineralized Tissues", J. Materials Research Society, vol. 27, No. 19, pp. 2568-2577, 2012.

Kaczmarek,"Backscattered Electrons Topographic Mode Problems in the Scanning Electron Microscope", Scanning Microscopy, vol. 12, No. 1, pp. 161-169, 1998.

Office Action in German patent application No. 10 2012 017 950.2, Jun. 5, 2013.

Paluszynski et al.,"Measurements of the surface microroughness with the scanning electron microscope", Journal of Microscopy, vol. 233, Pt. 1, pp. 10-17, 2009.

Roschger et al.,"Validation of Quantitative Backscattered Electron Imaging for the Measurement of Mineral Density Distribution in Human Bone Biopsies", Elsevier Science Inc., Bone, vol. 23, No. 4, pp. 319-326, 1998.

Skedros et al.,"The Meaning of Graylevels in Backscattered Electron Images of Bone", Journal of Biomedical Materials Research, vol. 27, pp. 47-56, 1993.

Zhao et al.,"Quantitative Backscattered Electron Analysis of Cement Paste", Cement and Concrete Research, vol. 22, pp. 695-706, 1992.

* cited by examiner

PARTICLE BEAM MICROSCOPE FOR GENERATING MATERIAL DATA

CROSS-REFERENCES TO RELATED APPLICATIONS

This application claims priority of Patent Application No. 10 2012 017 950.2, filed Sep. 11, 2012 in Germany, the entire contents of which are incorporated by reference herein.

FIELD

This invention relates to a particle beam microscope for acquiring information related to material properties of an object. More specifically, this invention relates to a particle beam microscope for determining material properties by scanning a particle beam across an object surface and detecting particles, which are emitted from an interaction region of the particle beam with the object.

BACKGROUND

There are known particle beam microscopes, which are configured to scan a focused primary electron beam across a region of the object surface and to detect particles, which are emitted from an interaction region where the scanning primary electron beam interacts with the object.

Depending on the detector system that is used, the detected particles are backscattered electrons and/or secondary electrons. The backscattered electrons are electrons, which are backscattered from the object. The secondary electrons are object particles, which are emitted from the object by the impact of the primary electron beam.

The backscattering coefficient of the backscattered electrons is significantly dependent on the atomic number of the material located at the impingement location of the electron beam. As a consequence, electron microscopic images, which are generated by detecting backscattered electrons, typically show regions of different material composition.

However, it has shown, that using these images, it is not possible to reliably determine material properties in the interaction regions of the scanned electron beam with the object.

Hence, it is desirable, to provide a method and a particle beam microscope, which allow to obtain reliable data about material properties of the object.

SUMMARY

Embodiments provide a method of operating a particle beam microscope. The method comprises scanning a particle beam across a scanning region of a surface of the object. The method may further comprise detecting particles, by a detector system, for a plurality of impingement locations of the primary beam within the scanning region. The detected particles may be released from an interaction region at the respective impingement location, wherein in each of the interaction regions, the primary beam interacts with the object. The method may further comprise generating, by the detector system, detector signals which represent for each of the impingement locations an intensity of the detected particles. The method may further comprise calculating material data of the interaction regions depending on the detector signals and depending on topography data, which represent a topography of the object surface in at least a portion of the scanning region.

Thereby, a method is provided, which allows to reliably determine material properties of the inspected object. By way of example, the method allows to determine the elemental content of one or more elements, information on the material composition and/or information on an crystallographic orientation of the object in the interaction regions in a reliable manner.

The particle beam microscope may be a scanning particle beam microscope. The scanning particle microscope may be a scanning electron microscope and/or a focused ion beam microscope. The focused ion beam microscope may comprise a gas field ion source, a plasma ion source and/or a liquid metal ion source. By way of example, the focused ion beam microscope is a helium ion microscope.

The particle beam microscope may comprise a particle optical system, which is configured such that the primary beam is focusable on the scanning region. The detector system may comprise one or more detectors. The detector system may be at least partially disposed within and/or outside of the particle optical system. Detector systems, which are disposed within the particle optical system, are referred to as in-lens detectors.

The detected particles may be primary particles of the particle beam, which are scattered from the object. The detected primary particles may be elastically and/or inelastically scattered from the object. The detected primary particles may be backscattered primary particles. Alternatively or additionally, the detected particles may be object particles, which are emitted from the interaction region. By way of example, the object particles are secondary electrons and/or secondary ions.

If the particle beam microscope is a scanning electron microscope, the primary particles, which are scattered from the object may be backscattered electrons. The detector system may comprise a backscattered electron detector (BSE detector), which is configured to selectively detect backscattered electrons. The BSE detector may for example be a semiconductor detector, a scintillator detector and/or a multi channel plate (MCP).

If the particle beam microscope is a helium ion microscope, the primary particles, which are scattered from the object may be backscattered helium ions. The detector system may comprise a helium ion detector, which is configured to selectively detect helium ions. By way of example, the helium ion detector may be a micro channel plate (MCP), which is configured to selectively detect helium ions. Alternatively or additionally, the helium ion detector may comprise a scintillator detector and/or a semiconductor detector. Additionally or alternatively, the helium ion detector comprises a conversion plate, which has a high conversion efficiency for a conversion of helium ions to secondary electrons.

Alternatively or additionally, the detector system comprises a secondary electron detector (SE-detector). The SE-detector may be configured to selectively detect secondary electrons.

The term "material data" may be defined herein as data, which at least partially characterize a presence and/or a content of a material component, a material composition and/or a material structure within the interaction region. The material component may be an elemental content of one or more elements. The material data may be independent or substantially independent from the topography of the surface. Material data, which at least partially characterize a presence or content of a material component and/or a material composition may for example comprise a value and/or a range of values of atomic numbers or mean atomic numbers. Material data, which at least partially characterize the material structure, may comprise for example a parameter of a crystal lattice. A parameter of the crystal lattice may be for example a value or a range of values representing a crystallographic orientation.

The material data may comprise separate data for each of at least a portion of the interaction regions. Thereby, it is possible to determine a change of a material content and/or a change of a fraction of a material content, and/or a change of a material composition, and/or a change of a material structure, which occur between different impingement locations.

According to an embodiment, the method comprises generating a look-up table representing a relationship between the material data on the one hand and at least the topography data and the portion of the detector signals on the other hand.

By way of example, the look-up table assigns a value or a range of values of mean atomic numbers to a combination of values and/or a combination of ranges of values of detector signals and inclinations of the object surface relative to the particle beam.

Hence, the look-up table may represent the dependency of the material data on the detector signals and on the topography data. Additionally, the look-up table may represent the dependency of the material data on further parameters.

Thereby, it is possible to calculate the material data depending on the detector signals and depending on the topography data in a time efficient manner.

The generation of the look-up table may comprise performing measurements on samples having known material properties. The known material properties may include a known presence of a material component, a known content of a material component, and/or a known material composition.

The generation of the look-up table may further comprise determining topography data of the samples having known material properties. The topography data may be determined by generating microscopic data.

The measurements for generating the look-up table may be performed for same impingement locations at different inclinations of the sample surface relative to the particle beam.

This allows to efficiently generate a look-up table, which represents a dependency of the material data on inclination data values of the object surface. The inclination of the sample surface relative to the particle beam may be varied by means of a positioning system and/or by varying a direction of the beam axis of the primary particle beam.

Additionally or alternatively, the generation of the look-up table comprises performing a Monte Carlo simulation of backscattering of primary particles and/or a Monte Carlo simulation of object particle emission. The Monte Carlo simulation may be based on assumed topography data and/or based on assumed material properties. The material properties may include a known presence of a material component, a known content of a material component, a known material composition and/or a known material structure.

The topography data may comprise a discrete function, which assigns to each of a plurality of points in a X-Y plane one or more function values and/or one or more vectors. The X-Y plane may be oriented perpendicular or substantially perpendicular to an axis of the primary beam. By way of example, the topography data assigns to each of a plurality of points a gradient of the surface at the respective point. Alternatively or additionally, the topography data assign to each of a plurality of points a value, which represents a height of the surface relative to the X-Y plane at the respective point.

The plurality of points of the topography data may correspond or substantially correspond to the impingement locations of the primary beam. Alternatively, a distance between neighboring points of the topography data in the X-Y plane may be smaller than 1000 times or smaller than 100 times or smaller 10 times or smaller than 5 times a spatial sampling interval during the scanning of the primary beam, or smaller than the spatial sampling interval. The spatial sampling interval may be defined as a spatial interval or pitch between neighboring impingement locations of the primary beam during the scanning process. The spatial sampling interval may correspond to a pixel spacing of an image acquired by the scanning of the primary beam.

In other words, the topography data may represent the topography of the surface with a resolution in the X-Y plane, which is more accurate than a 1000 times, or which is more accurate than 100 times or which is more accurate than 10 times, or which is more accurate than 5 times the spatial sampling interval. The resolution in the X-Y plane may be more accurate than the spatial sampling interval.

The method may further comprise interpolating and/or extrapolating the topography data to portions of the scanning region, which are not represented by the topography data. By way of example, function values of the topography data, which correspond to neighboring points in the X-Y-plane, may be interpolated. Thereby, the topography data may only represent the topography of a portion of the scanning region.

For each of the plurality of points in the X-Y plane, the topography data may be an approximation of a pre-defined accuracy of a height of the object surface above the X-Y plane, of a directional derivative, and/or of a gradient of the object surface. The pre-defined accuracy may be selected such that the material data characterize material components, material compositions and/or material structures within the interaction regions to a predefined accuracy.

For example, local deviations of the surface inclination, which have a small extend in the X-Y plane, may not be represented by the topography data if these deviations or fluctuations only have an insignificant influence on the detector signals.

According to a further embodiment, the method further comprises calculating the topography data at least in part from the generated detector signals. In other words, the method may comprise calculating the topography data depending on at least a portion of the generated detector signals.

According to a further embodiment, the method further comprises generating the topography data depending on microscopic data. The microscopic data may be generated by a microscope, by an optical profilometer and/or by a tactile profilometer. The microscopic data may represent the topography of the object surface. The microscopic data may have a resolution in the X-Y plane, which is more accurate than 1 millimeter or more accurate than 10 micrometers or more accurate than 1 micrometer.

The microscope may be the particle beam microscope or a further microscope. The microscope may be a light optical microscope, a charged particle optical microscope and/or a scanning probe microscope. The scanning probe microscope may be for example an atomic force microscope (AFM) or a scanning tunneling microscope (STM). The light optical microscope may be for example a confocal microscope, such as a laser scanning confocal microscope. Additionally or alternatively, the light optical microscope may be configured such that an image of a region of the object plane is formed in an image plane.

The microscope for generating the topography data may comprise a detector system, which is configured to detect light and/or particles. The detecting of the light and/or particles may be performed separately for each of at least two separated solid angle regions.

According to a further embodiment, the microscopic data are generated at different focus distances.

The microscopic data may represent a plurality of microscopic images, wherein the images are generated at different focus distances. Each of the plurality of the microscopic images may at least partially show the scanning region. The focus distance may be measured relative to an optical system of the microscope. The focus distance may be defined as a distance of a focus of a particle beam or a focus of a light beam, measured from the optical system. Alternatively, the focus distance may be a distance of an object plane measured from the optical system, wherein the optical system is configured to form an image, in an image plane, of a region of the object plane.

The topography data may be calculated depending on a plurality of microscopic images. In each of the plurality of microscopic images, those image region are sharply focused, which represent object regions, which are located at a distance from the optical system, which corresponds to the focus distance.

According to a further embodiment, the microscopic data are generated at different inclinations of the object relative to an optical axis of the optical system of the microscope or relative to an axis of the primary beam of the microscope. The microscopic data may represent stereoscopic images.

By way of example, the microscope may be configured to vary an orientation of the axis of the primary beam relative to the optical system. Thereby, impingement locations of the primary beam may be scanned with at least two different directions of incidence. Alternatively or additionally, the microscope may be configured to vary the orientation of the object relative to the optical system.

According to a further embodiment, the method further comprises generating the topography data depending on design data for manufacturing the object.

The design data may at least partially characterize a topography of the object surface. The design data may be defined such that at least a section of a manufacturing process of the object depends on the design data. By way of example, the object may be a semiconductor element and the manufacturing process of a photo-mask, which is used for manufacturing the semiconductor element, is produced depending on the design data.

According to a further embodiment, the topography data comprise inclination data values of the object surface.

The inclination data values may represent an inclination of the object surface. The inclination data values may be measured relative to a plane, which is stationary relative to the object. The plane may be oriented perpendicular to an axis of the primary beam. The topography data may be configured to include separate inclination data values for one or more or all of the impingement locations. Additionally or alternatively, the topography data may be configured such that separate inclination data values are calculatable for one or more or all of the impingement locations, depending on the topography data.

The inclination data values may comprise values of a directional derivative of the surface along on or more directions. The directions may be oriented non-parallel relative to an axis of the primary beam.

Alternatively or additionally, the inclination data values include a magnitude of a gradient of the surface and/or a direction of the gradient of the surface. The inclination data values may include an inclination angle of the surface at one or more impingement locations relative to an axis of the primary beam and/or an inclination direction of the surface at the impingement locations. The inclination direction may be defined as a direction of the steepest slope. The inclination may be measured relative to a plane, which is stationary relative to the object. The plane may be oriented perpendicular to or substantially perpendicular to an axis of the primary beam.

According to a further embodiment, the detected particles are a fraction of a plurality of emitted particles, which are emitted from the respective interaction region into vacuum in all directions. The method may further comprise determining, for each of the impingement locations, the intensity of the emitted particles. The calculation of the material data may be performed depending on the determined intensity of the emitted particles.

Hence, in spite of the dependency of the detector signals on the topography of the object surface, it is possible to determine for each of the impingement locations the intensity of the emitted particles at the respective impingement location.

The intensity of the emitted particles may be determined depending on the topography data and/or depending on the intensity of the detected particles.

The emitted particles may be primary particles and/or object particles. The primary particles may be backscattered particles. The object particles may be secondary ions and/or secondary electrons.

According to a further embodiment, the method comprises determining a backscattering coefficient for each of at least a portion of the interaction regions. The backscattering coefficient may be determined depending on the determined intensity of the emitted particles and/or depending on the topography data.

The backscattering coefficient may be defined as a ratio of emitted backscattered primary particles, which are emitted from the interaction region into vacuum in all directions, relative to the number of incident primary particles being incident on the impingement location.

The backscattering coefficient thereby is independent from the arrangement of the detectors of the particle beam microscope.

According to a further embodiment, the material data are further calculated depending on the determined backscattering coefficients.

The backscattering coefficient may depend on an inclination of the surface at the impingement location relative to the primary beam. The method may comprise determining a dependency of the backscattering coefficient on the inclination of the object surface. The calculation of the material data may be performed depending on the determined dependency of the backscattering coefficient on the inclination of the object surface.

The backscattering coefficient may further depend on a crystallographic orientation of a crystal lattice in the interaction region. A plane incident electron wave may propagate inside the crystal as a Bloch-wave field, which shows anomalous absorption or transmission depending on the angle of incidence relative to the lattice planes. The method may comprise determining a dependency of the backscattering coefficient on the crystallographic orientation.

The dependency of the backscattering coefficient on the inclination of the surface and/or the on the crystallographic orientation of the crystal lattice may be calculated theoretically or may be determined by calibration measurements. The theoretical calculation may include a Monte Carlo simulation of backscattering of primary particles based on an assumed inclination of the surface, an assumed crystallographic orientation of the crystal lattice and/or based on assumed material properties. The calibration measurements may be performed by using a hemispherical or a full spherical retarting field analyzer.

According to a further embodiment, the material data comprise a value and/or a range of values of mean atomic numbers of atoms within the interaction region and/or a parameter of a structural arrangement of the atoms.

The mean atomic number may be defined as an average of the atomic numbers of all atoms of the interaction regions from which the backscattered primary particles are scattered. The parameter of the structural arrangement of the atoms may for example be a parameter of a crystal structure and/or a parameter of a crystal orientation.

According to a further embodiment, the detection of the particles comprises selectively detecting primary particles. In other words, the detection of the object particles may be suppressed.

For example, a detection efficiency of the detector system for detecting object particles may be lower than one half or lower than one fifth or lower than one tenth or lower than one hundredth of a detection efficiency of primary particles. The selectively detected primary particles may be backscattered primary particles.

Alternatively or additionally, the calculation of the material data may comprise determining a fraction of the intensity of the detected particles, which is caused by primary particles.

Thereby, a method is provided, which allows to increase the accuracy of the determined material data, since the influence of the emitted object particles on the detector signals is reduced.

The particles, which are emitted from the interaction region may comprise primary particles, which are elastically or inelastically scattered from the object, and/or object particles, which are emitted from the interaction region. The object particles may be secondary electrons and/or secondary ions.

The detector system may be configured to selectively detect primary particles. The detector system may be configured to suppress a detection of object particles. The selective detection of the primary particles may be performed by a solid angle selective detection and/or an energy selective detection of the detector system.

Alternatively or additionally, a fraction of the intensity of detected particles, which is caused by object particles, may be determined depending on signals of the detector system. For example, the fraction may be determined depending on signals of a detector, which is configured to detect object particles and to suppress the detection of primary particles, such as a secondary electron detector. Alternatively or additionally, it is conceivable, that the fraction, is determined by calculation depending on the topography data.

The selective detection of the primary particles may comprise an energy selective and/or a solid angle selective detection of the emitted particles. The detector system may be configured for an energy selective and/or solid angle selective detection. This may allow to suppress a detection of object particles. The object particles may have an energy distribution and/or may have angular emission characteristics, which are different from the energy distribution and/or angular emission characteristics of the primary particles.

The energy selective detection may comprise selectively detecting particles, which have an energy, which is below a threshold energy or which exceeds a threshold energy. This allows for example to separate object particles, which predominantly have an energy, which is lower than the threshold energy, from primary particles, which predominantly have an energy, which is higher than the threshold energy.

Alternatively or additionally, the detector system may be configured such that an amplification of the detector signals depends on the energy of the detected particles.

According to a further embodiment, the detecting of the particles comprises separately detecting the particles in two, three, four or more mutually separated detector solid angle regions. The detection may be performed separately for each of the detector solid angle regions. In other words, the detector system is configured to detect the intensity of the emitted particles in the mutually separated detector solid angle regions in a solid angle selective manner. Thereby, it is possible to reliably calculate the topography data from the detector signals.

The mutually separated detector solid angle regions may be non-overlapping. The detector solid angle regions may be measured relative to the scanning region. The detector solid angle regions may be arranged along a circumferential direction about the axis of the primary beam. The detector solid angle regions may be arranged distant from each other or equally spaced from each other along the circumferential direction. At least two of the detector solid angle regions may be arranged pairwise in a diametrically opposed relationship relative to the axis of the primary beam.

According to a further embodiment, the detector signals comprise a solid angle detector signal for each of the detector solid angle regions. The method may further comprise generating the topography data depending on the solid angle detector signals.

The solid angle detector signals may represent an intensity of the detected particles in the respective detector solid angle region.

According to a further embodiment, the calculation of the material data further comprises determining an intensity data value for each of the detector solid angle regions depending on the solid angle detector signal of the respective detector solid angle region. The intensity data value may be proportional to or may represent an intensity of the particles, which are detected in the respective detector solid angle region.

The calculation of the material data and/or the determining of the topography data may further be performed depending on a sum of and/or depending on a difference between the intensity data values of at least two detector solid angle regions. The two detector solid angle regions, which are used for forming the sum and/or the difference may be aligned in a diametrically opposed relationship relative to the axis of the primary beam and/or may be aligned with mirror symmetry about a symmetry plane, in which the axis of the primary beam is located.

The method may further comprise determining a directional derivative of the object surface at a plurality of impingement locations depending on the sum and/or depending on the difference determined for the respective impingement location. The directional derivative may be a directional derivative along a direction, which is oriented perpendicular to the symmetry plane.

The sum and/or the difference may be determined for each of a plurality of impingement locations depending on the intensity data values determined for the respective impingement location. The sum and/or the difference may depend on the topography of the object surface. The calculation of the material data may comprise reducing or eliminating a topography dependency of the sum and/or of the difference of the intensity data values. The method may further comprise determining a directional derivative of the object surface at a plurality of impingement locations depending on the sum and/or depending on the difference determined for the respective impingement location.

According to a further embodiment, the method further comprises displaying a particle microscopic image of an object region of the object on a display. The method may further comprise determining, depending on the material data, an image region of the particle microscopic image, which corresponds to a predefined material property of the interaction regions. The method may further comprise highlighting, in a visually recognizable manner, the determined image region on the display.

Thereby, it is possible to clearly illustrate material properties of the interaction regions such that an efficient and accurate inspection of the object can be performed.

Pixel data values of the particle microscopic image may be determined depending on detected primary particles and/or detected object particles, which are emitted from the interaction regions. The material property may at least partially characterize the presence and/or the content of a material component, a material composition and/or a material structure in the interaction regions. The material property may be a material property of the interior of the interaction regions. In other words, the material property may be independent from the topography of the surface of the object. For example, the material property may be a value or a range of values of mean atomic numbers, and/or a parameter of a crystallographic orientation. The image region may be determined depending on the predefined material property and the material data, e.g. by comparing the predefined material property with the material data. The predefined material property may be, for example, selected by an operator or determined by a computing system.

Embodiments provide a particle beam microscope, comprising a particle optical system, which is configured to scan a primary beam across a scanning region of a surface of an object. The particle beam microscope further comprises a detector system, which is configured to detect particles for a plurality of impingement locations of the primary beam within the scanning region. The detected particles may be released from an interaction region of the respective impingement location, wherein in each of the interaction regions, the primary beam interacts with the object. The detector system may further be configured to generate detector signals, which represent for each of the impingement locations an intensity of the detected particles. The particle beam microscope may further comprise a computing system, which is configured to calculate material data of the interaction regions depending on the detector signals and depending on topography data. The topography data may represent a topography of the object surface in at least a portion of the scanning region.

The computing system may include a computer. The computer may include a display and a storage system.

According to a further embodiment, the detector system is configured to detect the particles in two, three, four or more mutually separated detector solid angle regions. The detection of the particles may be performed separately in each of the detector solid angle regions.

The detector system may comprise a plurality of particle receiving surfaces. The detector solid angle regions may be determined by a geometry and/or an arrangement of the particle receiving surfaces. Alternatively or additionally, the detector solid angle regions may depend on electrical and/or magnetic fields, which deflect the particles. For example, the detector solid angle region of in-lens detectors (i.e. detectors, which are arranged in the interior of the particle optical system) depends on the geometry and the arrangement of the particle receiving surface, as well as on the effect of the electric and/or magnetic fields of the objective lens on the trajectory of the detected particles.

The detector signals may comprise a solid angle detector signal for each of the detector solid angle regions. According to an embodiment, the computing system is configured to calculate the topography data depending on the solid angle detector signals.

According to a further embodiment, two of the detector solid angle regions are aligned with mirror symmetry about a first symmetry plane, in which an axis of the primary beam is located.

Thereby, a particle beam microscope is provided, which allows to accurately determine the topography data depending on the detector signals.

The computing system may be configured such that depending on the solid angle detector signals, of the two detector solid angle regions, which are aligned with mirror symmetry, a directional derivative of the object surface along a direction perpendicular to the symmetry plane is determined.

Depending on the solid angle detector signals, intensity data values are determinable for each of the detector solid angle regions and for each of the impingement locations. The directional derivative of the object surface at an impingement location may be determined depending on a difference between and/or a sum of the intensity data values of the two detector solid angle regions at the impingement location.

According to a further embodiment, the detector system is configured to separately detect the particles in four mutually separated detector solid angle regions. A first pair of detector solid angle regions may be aligned with mirror symmetry about a first symmetry plane, in which an axis of the primary beam is located. A second pair of detector solid angle regions may be aligned with mirror symmetry about a second symmetry plane, in which the axis of the primary beam is located.

The first symmetry plane may be inclined relative to the second symmetry plane. The first and the second symmetry planes may be oriented perpendicular relative to each other. An intersection line of the first symmetry plane with the second symmetry plane may be aligned with or oriented parallel to the axis of the primary beam.

The computing system may be configured to calculate a first directional derivative along a direction perpendicular to the first symmetry plane and/or a second directional derivative along a direction perpendicular to the second symmetry plane depending on the solid angle detector signals of the four detector solid angle regions.

The detector system may comprise for example a four-quadrant BSE detector (4Q-BSE detector). The four-quadrant BSE detector may be arranged between the objective lens and the object, in particular at an exit opening of the objective lens, through which the primary beam exits from the objective lens. The four-quadrant BSE detector comprises four electron receiving surfaces, which are arranged equally spaced from each other along a circumferential direction about the axis of the primary beam.

Thereby, a particle beam microscope is provided, which allows to determine directional derivatives of the object surface in two different directions with a high accuracy.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

Figure 1:
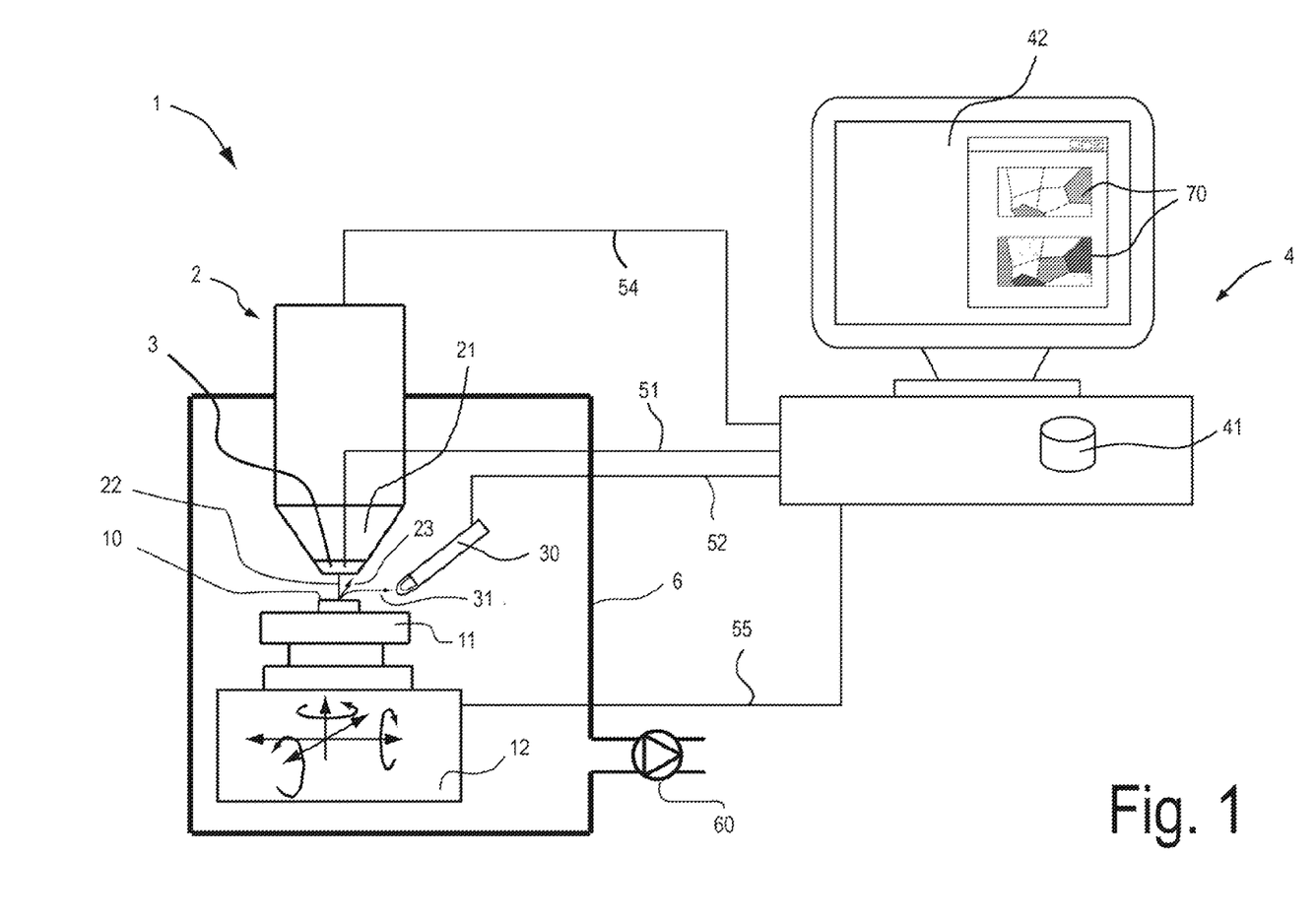
FIG. 1 is a schematic illustration of a particle beam microscope according to an exemplary embodiment.

FIG. 1 is a schematic illustration of a particle beam microscope 1 according to an exemplary embodiment. The particle beam microscope 1, which is shown in FIG. 1, may be for example a scanning electron microscope or a focused ion beam microscope.

The particle beam microscope 1 comprises a specimen chamber 6, which is configured as a vacuum chamber. To this end, the particle beam microscope 1 comprises a vacuum pumping system 60, which is configured to maintain a vacuum pressure level within the specimen chamber 6. A positioning system 12 is arranged within the specimen chamber 6, to which an object holder 11 is attachable. The object 10 is supported by the object holder 11. The positioning system 12 is configured to position the object 10, relative to a particle optical system 2 of the particle beam microscope 1.

The particle optical system 2 comprises an objective lens 21. The particle optical system 2 is configured to generate a particle beam 22 of primary particles and to focus the particle beam 22 on the object surface of the object 10 in order to scan a scanning region of the object surface.

At each of a plurality of impingement locations in the scanning region, the primary particles penetrate into an interaction region below the object surface. In the interaction region, the primary beam 22 interacts with the object 10.

The particle beam microscope 1 comprises a detector system 3. The detector system 3 is configured to detect a portion of the primary particles of the primary beam 22, which is backscattered at the object 10, wherein the detection of secondary electrons is suppressed. Thereby, the detector signals of the detector system 3 represent substantially an intensity of detected backscattered primary particles.

When the particle beam microscope is a scanning electron microscope, the detector system 3 may for example be a BSE-detector (backscattered electron detector), in particular a 4Q-BSE detector (4-Quadrant BSE detector).

When the particle beam microscope is a helium ion microscope, the detector system 3 may be a helium ion detector, which may for example be configured as a MCP (multi channel plate).

The particle beam microscope 1 further comprises a secondary electron detector 30, which is configured to detect secondary electrons, which are emitted from the interaction regions where the particle beam 22 interacts with the object 10.

In the exemplary embodiment, which is illustrated in FIG. 1, each of the detector system 3 and the secondary electron detector 30 are disposed within the preparation chamber 6. However, it is also conceivable, that the detector system 3 and/or the secondary electron detector 30 are arranged within the particle optical system 2.

The particle beam microscope 1 is configured to obtain reliable information on material properties of the object in the interior of the interaction regions by processing the signals of the detector system 3. This is described in detail with reference to the subsequent figures.

The particle optical system 2, the positioning system 12, the detector system 3 and the secondary electron detector 30 is in signal communication with the computing system 4 via signal lines 51, 52, 54 and 55.

The computing system 4 is configured to position the object 10 relative to the particle optical system 2 by controlling the positioning system 12 such that a surface region of the object 10 is scannable by the particle beam 22. Furthermore, the computing system 4 is configured to control the particle optical system 2 for scanning the surface region. The computing system 4 is further configured to process the detector signals of the detector system 3 and the secondary electron detector 30 and to store the detector signals on the storage system 41.

The computing system 4 further comprises a display 42. The particle beam microscope 1 is controllable by an operator via a graphical user interface of the computing system 4. Furthermore, the computing system 4 is configured to display particle optical images 70 on a display 42 via the graphical user interface.

Figure 2:
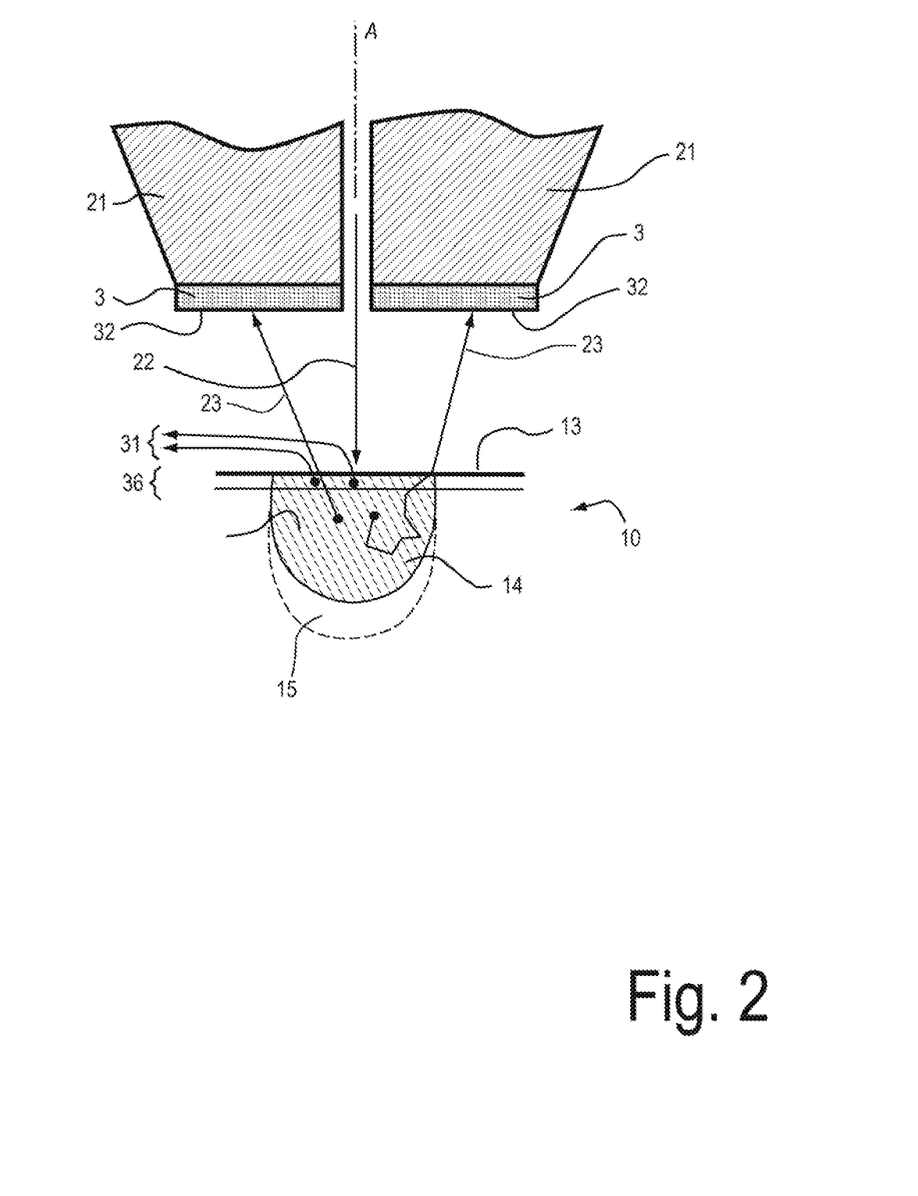
FIG. 2 schematically illustrates the interaction of the primary beam with the object in the particle beam microscope, illustrated in FIG. 1.

FIG. 2 illustrates the interaction between the primary beam 22 of the particle beam microscope 1 (shown in FIG. 1) and the object 10. The primary beam 22 exits from the objective lens 21 and impinges on a surface 30 of the object 10. An interaction between the primary particles of the primary beam 22 and the object 10 occurs in an interaction region 15. From a portion 14 of the interaction region 15, which is adjacent to the object surface 13, a portion of the primary particles of the primary beam 22 exits from the object 10 after one or more scattering processes. The scattering processes may be elastic scattering processes and/or inelastic scattering processes. A portion of the primary particles 23, which are emitted from the object 10, impinges on a particle receiving surface 32 of the detector system 3 and is detected by the detector system 3. The particle receiving surface 32 of the detector system 3 is ring-shaped and surrounds an axis A of the primary beam 22. The detector system 3 is arranged at an exit opening of the object lens 21, through which the primary beam 22 exits from the objective lens 21. Alternatively, the detector system 3 may comprise a plurality of particle receiving surfaces, which are arranged equally spaced from each other along a circumferential direction about the axis A of the primary beam 22. By way of example, the detector system 3 may comprise four particle receiving surfaces.

Through the interaction of the primary particles with the object 10, secondary electrons 31 are emitted from a region 36 of the interaction region 15, which is located close to the object surface 13. A predominant portion of the secondary electrons 31 has an energy which is smaller than an upper limit. The upper limit may range between 50 and 100 electron volts. As a result of the low energy of the secondary electrons 31, the secondary electrons 31 can be deflected toward the secondary electron detector 30 (shown in FIG. 1) by an electrostatic potential difference of typically 100 electron volts relative to the object surface 13.

At a sufficiently high energy of the primary beam 22, a predominant portion of the backscattered primary particles has an energy, which is higher than the energy of a predominant portion of the secondary electrons. Thereby, it is possible to suppress a detection of secondary electrons by energy selective detection.

Figure 3A:
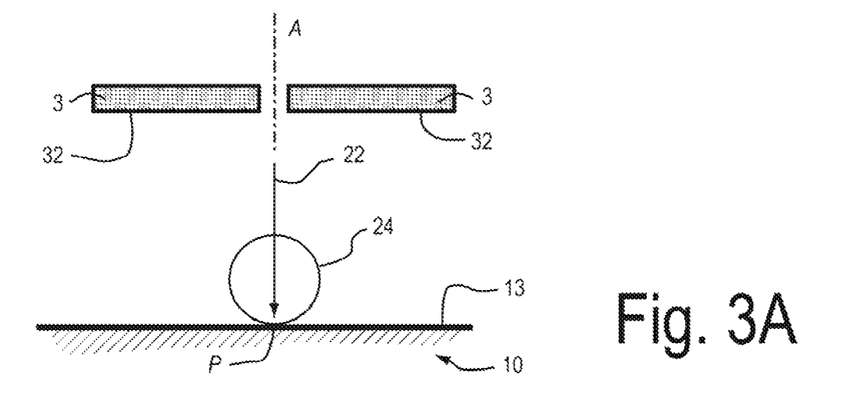
FIGS. 3A and 3B schematically illustrate the dependency of the detector signals of the particle beam microscope, illustrated in FIG. 1 on the topography of the object surface.

FIG. 3A illustrates a typical angular emission characteristic 24 of backscattered primary particles of the primary beam microscope, when the primary beam 22 impinges perpendicularly on the object surface 13 at the impingement location P, i.e. at an inclination angle of the object surface of 0 degrees at the impingement location P. The inclination angle may be defined as an angle between a beam axis A of the primary beam and a surface normal $\vec{n}$ of the object surface 13 at the impingement location P. The zero point of the angular emission characteristic 24 shown in FIG. 3A coincides with the impingement location P. The angular emission characteristic 24 represents a differential backscattering coefficient $d\eta/d\Omega$, i.e. the derivative of the backscattering coefficient $\eta$ with respect to the solid angle $\Omega$.

As can be seen in FIG. 3A, the maximum of the angular emission characteristic 24 is located at an emission direction, which is substantially opposite to the impingement direction of the primary beam 22. Furthermore, the angular emission characteristic 24 is rotationally symmetric relative to the axis A of the primary beam 22.

Figure 3B:
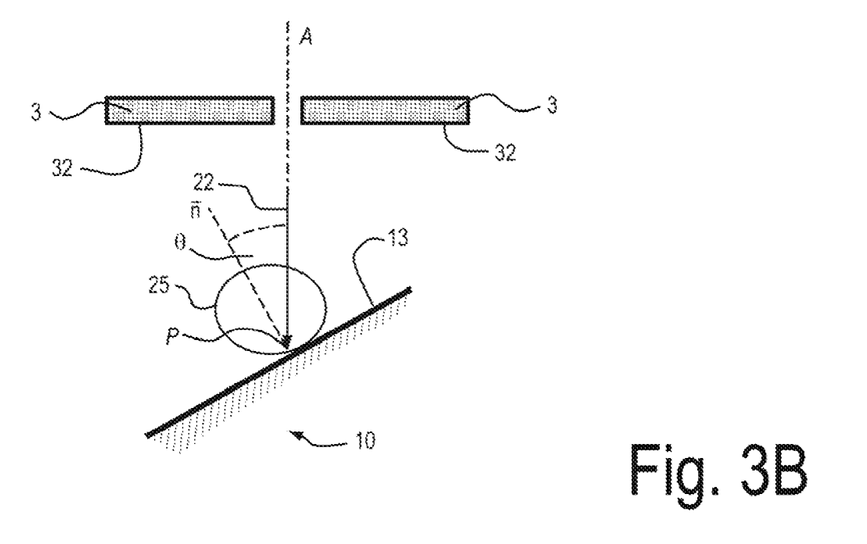

FIG. 3B illustrates a typical angular emission characteristic 25 of backscattered primary particles, when the object surface 13 has an inclination angle $\theta$ of 30 degrees at the impingement location. The zero point of the angular emission characteristic 25 coincides with the impingement location P.

As a result of the inclination of the object surface 13 relative to the axis A of the primary beam 22 at the impingement location P, the angular emission characteristic 25 is not rotationally symmetric relative to the axis A of the incident primary beam 22. Furthermore, the angular emission characteristic 25 is also not rotationally symmetric relative to a symmetry axis, which includes the impingement location P and which is parallel to the normal vector $\vec{n}$ of the object surface 13.

Each of FIGS. 3A and 3B illustrate the detector system 3 having the particle receiving surface 32. As can be seen by comparing FIG. 3A with FIG. 3B, the detector signals of the detector system 3 vary depending on the inclination of the object surface 13. In particular, as a result of the angular emission characteristic 25, which is illustrated in FIG. 3B, a larger portion of the backscattered primary particles is no longer incident on the particle receiving surface 32 of the detector system 3 and is therefore not detected.

Figure 4A:
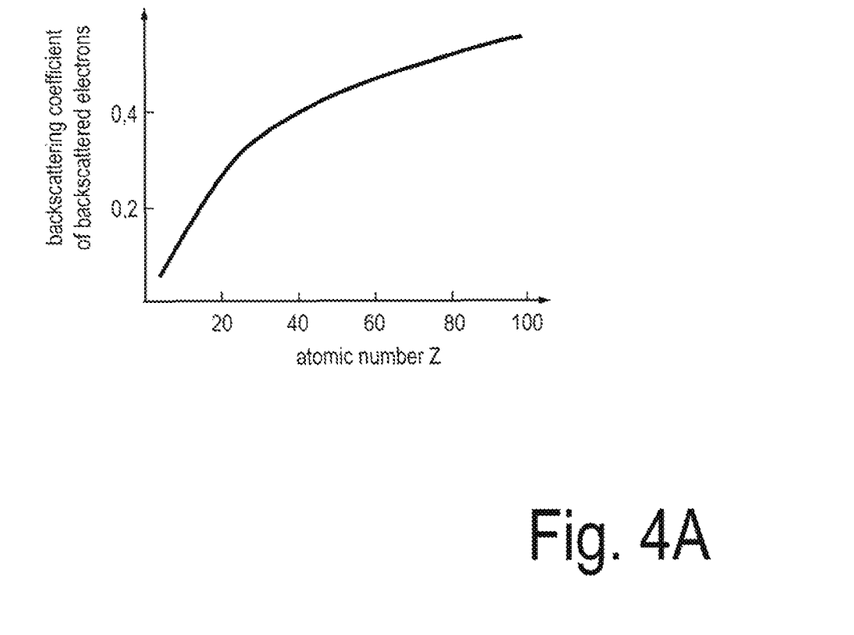
FIGS. 4A and 4B schematically illustrated the dependency of the backscattering coefficient of the backscattered electrons on the atomic number and on the inclination angle.

The computing system 4 (shown in FIG. 4) may be configured to determine the material data depending on a look-up table. The look-up table may be stored on the storage system.

The look-up table may represent a relationship between the material data on the one hand and at least the intensities of the detected particles and the topography data on the other hand. Hence, the look-up table may represent the dependency of the material data on intensities of the detected particles and on the topography data.

The look-up table may be generated by performing measurements on samples having known material properties. The known material properties may include a known presence of a material component, a known content of a material component, a known material composition and/or a known material structure.

The look-up table may further be generated by determining topography data of the samples. The topography data may be determined by a particle beam microscope, by a light optical microscope and/or by a scanning probe microscope. Methods for determining topography data are described detail below.

The measurements for generating the look-up table may be performed for same impingement locations at different inclinations of the sample surface relative to the particle beam. This allows to efficiently generate a look-up table, which represents a dependency of the material data on inclination data values of the object surface.

Additionally or alternatively, the generation of the look-up table comprises performing a Monte Carlo simulation of backscattering of primary particles and/or a Monte Carlo simulation of object particle emission. The Monte Carlo simulation may be based on assumed topography data and/or based on assumed material properties. The material properties may include a known presence of a material component, a known content of a material component, a known material composition and/or a known material structure.

Additionally or alternatively, computing system 4 (shown in FIG. 1) may be configured such that depending on topography data of the surface 13 and depending on the detector signals of the detector system 3, the intensity of the backscattered particles, which are emitted into vacuum in all directions, can be determined. This allows to determine the material data depending on the backscattering coefficient. The intensity of the backscattered particles, which are emitted into vacuum in all directions, is independent from the geometry of the detector system 3.

The dependency of the intensity of the backscattered particles, which are emitted into vacuum in all directions, on the detector signals and further on the inclination of the object surface at the impingement location may be derived theoretically and/or experimentally through a calibration measurement.

By way of example, the angular emission characteristic of the backscattered primary particles may be derived theoretically depending on the surface inclination at the impingement location. The theoretical calculation may include performing a Monte Carlo simulation of backscattering of primary particles based on assumed topography data and based on assumed material properties.

The calibration measurement may for example comprise acquiring detector signals from samples depending on an inclination of the object surface relative to the primary beam 22. The inclination of the object surface may be adjusted via the positioning system 12 (shown in FIG. 1). Alternatively, topography data of the samples may be known.

The samples may have known material properties, such as a known presence, a known content of a material component, a known material composition and/or a known material structure.

The intensity of particles, which are emitted into vacuum into all directions may be measured for samples by using a hemispherical or a full spherical retarding field energy analyzer. The intensity may be measured for different inclinations of the object surface relative to the particle beam.

The computing system 4 is may further be configured to determine a backscattering coefficient from the determined intensity of the emitted backscattered particles, which are emitted into vacuum in all directions.

The backscattering coefficient may be defined as a ratio of emitted backscattered primary particles which are emitted from the interaction region into vacuum in all directions relative to the number of incident primary particles being incident on the impingement location.

Hence, the backscattering coefficient is independent from the arrangement of the particle receiving surface 32.

The backscattering coefficient depends on the atomic number or mean atomic number of the scattering atoms present in the interaction region. Furthermore, the backscattering coefficient may also depend on a parameter of a crystal structure, in particular on a parameter defining a crystallographic orientation of the material in the interaction region. Hence, it is possible to calculate material data, which represent material properties in the interior of the interaction regions, depending on the backscattering coefficient.

The dependency of the backscattering coefficient on the atomic number for a scanning electron microscope is illustrated in FIG. 4A. As can be seen from FIG. 4A, the backscattering coefficient is a monotonically increasing function of the atomic number Z.

A look-up table may be stored on the storage system 41 (shown in FIG. 1), which assigns data values, which represent the backscattering coefficient to a value and/or to a range of values of mean atomic numbers.

Additionally or alternatively, it is conceivable, that the material data are calculated depending on detector signals, which represent backscattered primary particles and object particles (such as secondary electrons) or which represent object particles without a significant amount of backscattered particles. The emission of object particles, which are emitted into vacuum in all directions, may be derived theoretically and/or experimentally. The emission of the object particles may be derived experimentally depending on the inclination of the object surface.

Figure 4B:
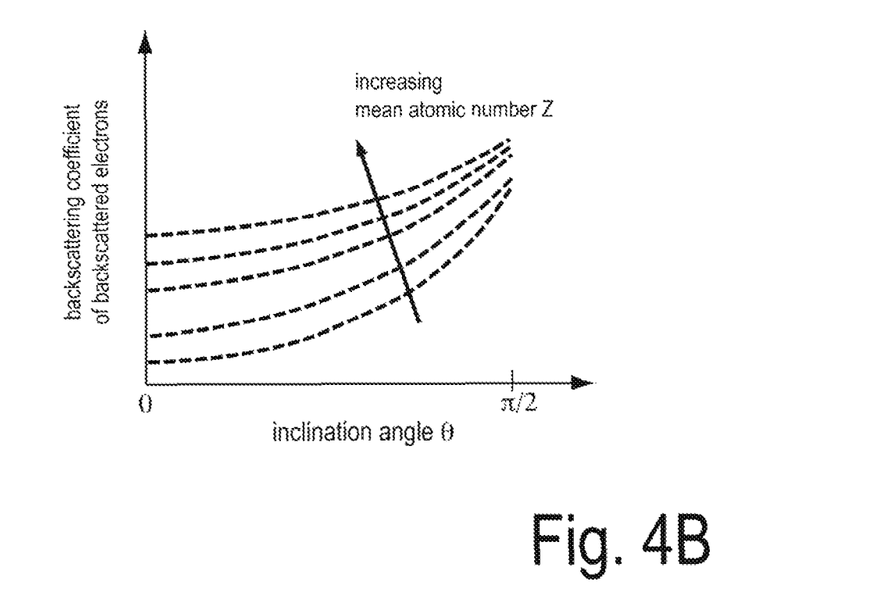

FIG. 4B shows a diagram, which illustrates that the backscattering coefficient of backscattered electrons further depends on the inclination angle at the impingement location. This dependency has an influence on the detector signal in addition to the influence caused by the variation of the orientation of the angular emission characteristic relative to the particle receiving surfaces 32, which has been described with reference to FIGS. 3A and 3B.

The effect of the dependency of the backscattered coefficient on the inclination angle can be neglected at low inclination angles of the object surface. Alternatively, the computing system may be configured such that the determined backscattering coefficient is corrected depending on the surface inclination at the impingement location. Additionally or alternatively, the look-up table, which is stored on the storage system 41, may assign a mean atomic number to each of a plurality of value pairs consisting of a backscattering coefficient and an inclination angle.

The calculation of the material data thereby may be performed depending on the dependency of the backscattering coefficient on the inclination of the surface relative to the primary beam.

The dependency of the backscattering coefficient on the inclination of the surface may for example be calculated theoretically or may be determined by calibration measurements. The theoretical calculation may include a Monte Carlo simulation of backscattering of primary particles based on an assumed inclination of the surface and based on assumed material properties. The calibration measurements may be performed by using a hemispherical or a full spherical retarting field analyzer.

Figure 4C:
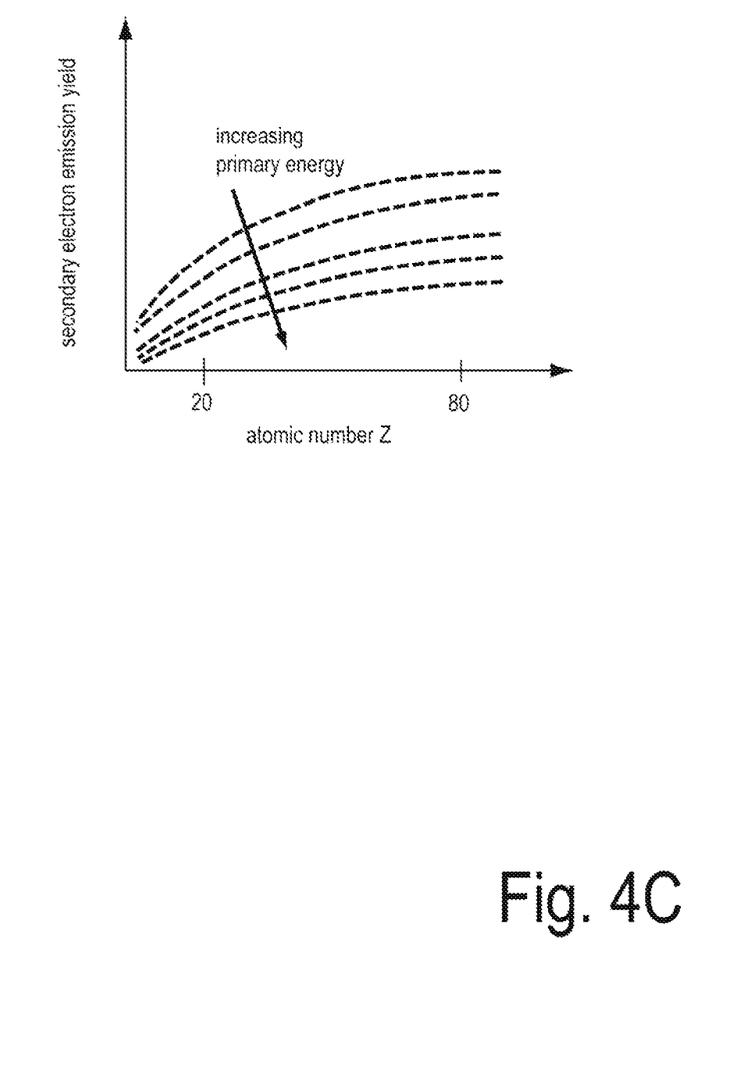
FIG. 4C schematically illustrates the dependency of the secondary electron emission yield on the atomic number and on the primary energy of the primary beam.

FIG. 4C illustrates the dependency of the secondary electron emission yield on the mean atomic number Z and on the primary energy of the primary beam of the scanning electron microscope. The secondary electron emission yield may be defined as the number of emitted secondary electrons, divided by the number of primary electrons, which are incident on the impingement location and which generate the number of secondary electrons.

As can be seen from FIG. 4C, the dependency of the secondary electron emission yield on the mean atomic number Z is high at a low primary energy of the primary beam.

Also, at low primary energies, the accuracy of the energy selective separation of the backscattered electrons from the secondary electrons decreases, since the energy distributions increasingly overlap with decreasing primary beam energy.

It has shown, that at a low primary energy, the material data can be determined with high accuracy when the intensity fraction of the intensity of the detected electrons, which is caused by the secondary electrons, is determined and subtracted.

The intensity fraction caused by the secondary electrons may for example be determined depending on signals of the secondary electron detector 30 (shown in FIG. 1). A dependency between the intensity of detected secondary electrons, detected by the secondary electron detector 30, and the intensity fraction, caused by the secondary electrons and detected by detector system 3 (shown in FIG. 1), may for example be determined by a calibration measurement and/or determined theoretically. The theoretical calculation of this dependency may comprise a Monte Carlo simulation of backscattered primary particles and emitted object particles. The theoretical calculation may be performed depending on the topography data.

Figure 5:
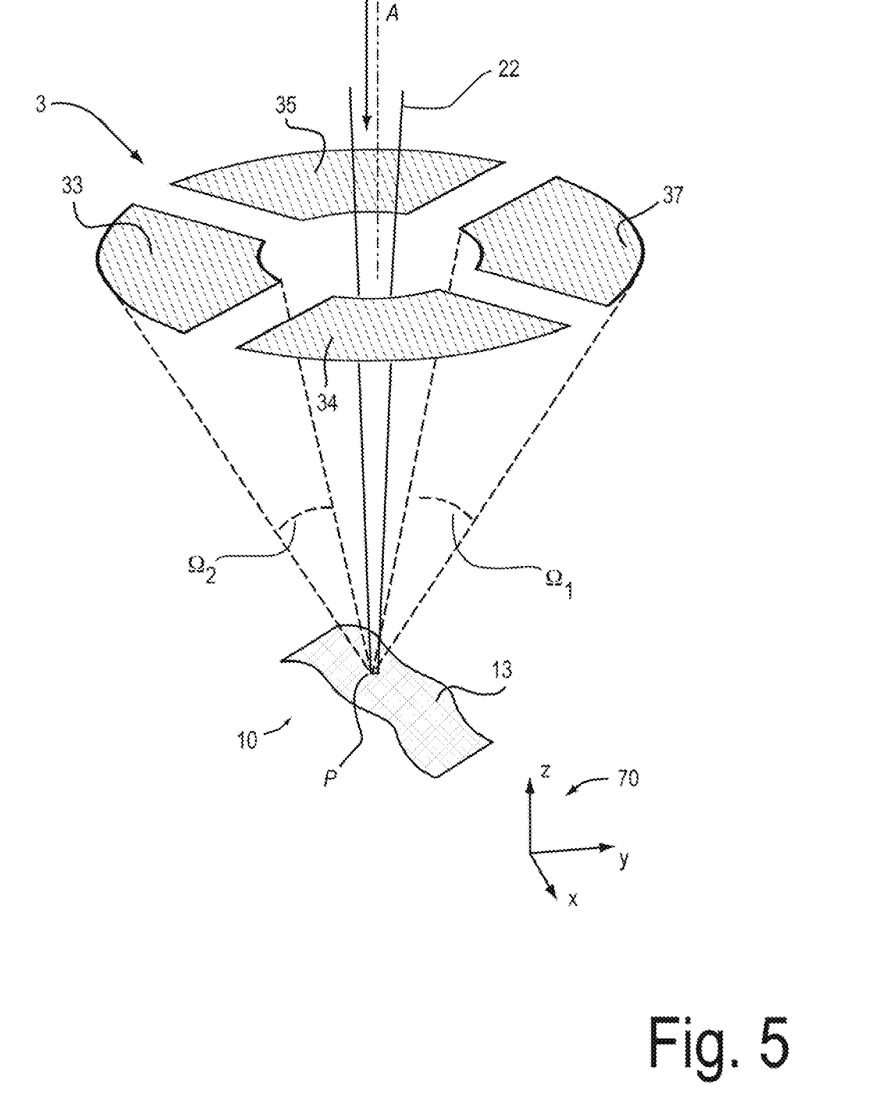
FIG. 5 schematically illustrates the arrangement of particle receiving surfaces of the detector system of the particle beam microscope illustrated FIG. 1.

In the following, with reference to FIG. 5, it will described, how the surface topography of the object is determined by using the particle beam microscope. FIG. 5 schematically illustrates the setup of the detector system 3 of the particle beam microscope 1, which is shown in FIG. 1. The detector system 3 comprises four detectors. Each of the four detectors separately detects incident backscattered particles. For each detector, the detector system generates a detector signal, which represents the intensity detected by the respective detector.

The hashed ring segments, which are illustrated in FIG. 5, are graphical representations of the particle receiving surface 37 of the first detector, the particle receiving surface 33 of the second detector, the particle receiving surface 34 of the third detector and the particle receiving surface 35 of the fourth detector. When a backscattered primary particle impinges on one of the particle receiving surfaces, it is detected by the respective detector. The detection is performed by the first to fourth detector simultaneously during a scan of the primary beam.

The particle receiving surface 37 of the first detector defines the detector solid angle region $\Omega_1$ of the first detector relative to the impingement location P of the primary beam 22. Backscattered primary particles, which are emitted from the object in a direction within the detector solid angle region $\Omega_1$, impinge on the particle receiving surface 37 of the first detector and can thereby be detected by the first detector. Accordingly, the particle receiving surface of the second detector 33 defines a detector solid angle region $\Omega_2$ of the second detector.

The detector solid angle region $\Omega_1$ of the first detector and the detector solid angle region $\Omega_2$ of the second detector are aligned with mirror symmetry about a first symmetry plane, within which an axis A of the primary beam 22 is located. The first symmetry plane is oriented parallel to the X-Z-plane in the coordinate system 70 which is shown in FIG. 5.

It has shown that, depending on the detector signals of the first and the second detector, the directional derivative of the surface 13 along a direction parallel to the Y-axis can be determined to a good approximation according to the following equation:

$$\frac{\partial f(x, y)}{\partial y} = \frac{I_1 - I_2}{I_1 + I_2} \cdot G_y, \quad (1)$$

wherein $f(x,y)$ represents a height value of the surface relative to the X-Y-plane at an impingement location. $f(x,y)$ depends on the coordinates X and Y of the X-Y-plane. Accordingly, the value $$\frac{\partial f(x, y)}{\partial y}$$

represents the directional derivative of the surface along a direction parallel to the Y-axis. $I_1$ is a value, which is proportional to the intensity of the backscattered primary particles, which are detected by the first detector and $I_2$ is a value, which is proportional to the intensity of the backscattered primary particles, which are detected by the second detector. The proportional dependency of both values on the respective intensity of detected particles is identical or substantially identical. $G_y$ is a proportionality factor.

Correspondingly, depending on the detector signals of the third and fourth detector, the directional derivative along the X-axis can be determined to a good approximation according to the following equation:

$$\frac{\partial f(x, y)}{\partial x} = \frac{I_3 - I_4}{I_3 + I_4} \cdot G_x, \quad (2)$$

wherein $I_3$ is a value, which is proportional to the intensity of the backscattered primary particles, which are detected by the third detector, and $I_4$ is a value, which is proportional to the intensity of the backscattered primary particles, which are detected by the fourth detector, wherein the proportional dependencies of both values on the respective intensity of detected particles is identical or substantially identical. $G_x$ is a proportionality factor.

The proportionality factors $G_x$ and $G_y$ may be determined by a calibration measurement. Alternatively or additionally, the proportionality factors $G_x$ and $G_y$ may be determined depending on material data of particle microscopic images, which have been calculated by assuming different values for $G_x$ and $G_y$. For example, the operator or the computing system 4 (shown in FIG. 1) may determine, for which assumed values of $G_x$ and $G_y$, artifacts are minimized or disappear. The artifacts may be generated by the dependencies of the signals of the first to fourth detectors on the inclination of the surface.

Depending on equations (1) and (2) above, the gradient vector $\vec{\nabla} f(x,y)$ of the surface function $f(x,y)$ can be determined. Thereby, it is possible to calculate topography data of the object surface depending on detector signals of the detector system 3. In particular, it is possible to calculate the topography data and the material data depending on a sum and/or a difference of intensities of particles detected by different detectors.

One or both of the directional derivatives, which are given in equations (1) and (2) may be used to determine from the intensity of the detected particles a mean atomic number or a range of mean atomic numbers for the interaction region. Furthermore, information about the crystal structure and/or the crystallographic orientation of the material within the interaction region may be obtained.

When large changes of the angle of incidence only occur substantially along one direction, it may be sufficient to determine only a single directional derivative for calculating the material data. Such objects may be obtained by an abrasive surface process, which carried out along a substantially constant processing direction. Thereby, it is possible to generate scratches, which are aligned with high accuracy along a common direction.

Depending on the values $I_1$, $I_2$, $I_3$ and $I_4$, an intensity data value is determined for each of the detectors and for each of the impingement locations, the intensity data value representing an intensity of particles detected by the respective detector. The intensity data values are summed up. The sum is dependent on material properties in the interaction regions, as well as dependent on the topography of the surface.

Depending on the sum and depending on the determined topography data, the backscattering coefficient at the impingement location may be determined.

By way of example, the backscattering coefficient may be determined depending on the orientation and/or depending on the form of the angular emission characteristic relative to the particle receiving surfaces 37, 33, 34 and 35.

Depending on the backscattering coefficient, a mean atomic number of the interaction region may be determined. When determining the mean atomic number, the dependency of the backscattering coefficient on the inclination angle may be taken into account.

Simultaneously with the detecting of the particles by the first to fourth detector, secondary electrons may be detected by the secondary electron detector 30 (shown in FIG. 1). Depending on detector signals of the secondary electron detector 30, a fraction of the detected particle intensity of the first, second, third and/or fourth detector may be determined, which is generated by secondary electrons.

Thereby, it is possible determine with high accuracy the values $I_1$, $I_2$, $I_3$ and $I_4$ depending on the detector signals of the respective detector and the detector signals of the secondary electron detector 30 such, that the respective value is proportional or substantially proportional to a number of the backscattered particles, which is detected by the respective detector.

Figure 6:
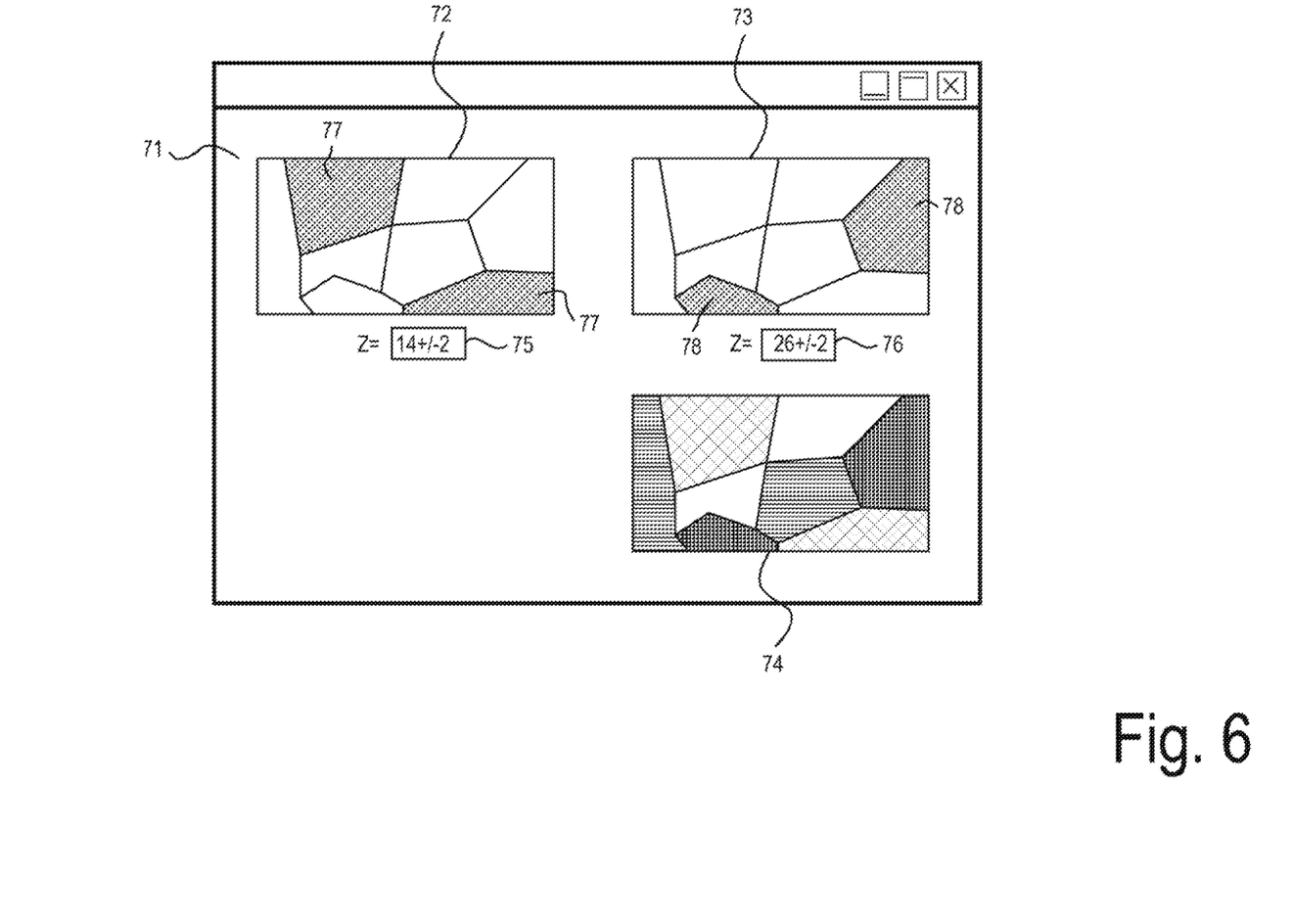
FIG. 6 schematically illustrates the operation of a graphical user interface of the particle beam microscope illustrated in FIG. 1.

FIG. 6 illustrates, how the obtained results are displayed by the graphical user interface of the particle beam microscope 1 (shown in FIG. 1).

The graphical user interface is configured such that the pixel data values of a particle microscopic image are displayed depending on the determined material data in three different representations in a window 71 of the graphical user interface. A first representation 72 highlights those pixels 77 of the particle microscopic image in a visually recognizable manner where a mean atomic number Z of between 12 and 16 has been determined. Thereby, the region, which is highlighted in the first representation 72 represents a surface region, which is indicative of a high content of silicon which has an atomic number of 14.

Correspondingly, in the second representation 73, those pixels 78 of the particle microscopic image are highlighted in a visually recognizable manner where a mean atomic number of between 24 and 28 has been determined. Thereby, the region, which is highlighted in the second representation 73 represents a surface region, which is indicative of a high content of iron which has an atomic number of 27.

The graphical user interface is further configured such that the ranges of mean atomic numbers for highlighting the representations can be inputted by the operator via input fields 75 and 76 generated by the graphical user interface.

Alternatively or additionally, the graphical user interface is configured such that different ranges of mean atomic numbers are highlighted in a same representation 74 in a visually distinguishable manner.

Thereby, a clear representation of material data is obtained, which allows an effective inspection of the object.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method of operating a particle beam microscope, the method comprising:
    scanning at least one particle beam across a scanning region of a surface of the object;
    detecting particles, by a detector system, for a plurality of impingement locations of the primary beam within the scanning region;
    wherein the detected particles are released from an interaction region at the respective impingement location, wherein in each of the interaction regions, the primary beam interacts with the object;
    generating, by the detector system, detector signals which represent for each of the impingement locations an intensity of the detected particles; and
    calculating material data of for at least a portion of the interaction regions depending on at least a portion of the detector signals and depending on topography data, which represent a topography of the object surface in at least a portion of the scanning region.

2. The method of claim 1, further comprising:
    calculating the topography data at least in part from the generated detector signals.

3. The method according to claim 1, wherein the topography data comprise inclination data values of the object surface.

4. The method according to claim 1,
    wherein the detected particles are a fraction of a plurality of emitted particles, wherein the plurality of the emitted particles are emitted from the respective interaction region into vacuum in all directions;
    wherein the method further comprises determining, for each of the portion of the interaction regions, an intensity of the emitted particles;
    wherein the calculating of the material data is performed depending on the determined intensities of the emitted particles.

5. The method according to claim 1, wherein the material data comprise at least one of a value and a range of values of at least one of a mean atomic number of atoms of the interaction region and a parameter of a structural arrangement of the atoms.

6. The method according to claim 1,
    wherein the detecting of the particles comprises selectively detecting primary particles.

7. The method according to claim 1, wherein the detecting of the particles comprises separately detecting at least a portion of the particles in two separate detector solid angle regions.

8. The method according to claim 7,
    wherein the detector signals comprise a solid angle detector signal for each of the detector solid angle regions; and
    wherein the method further comprises generating the topography data at least in part from the solid angle detector signals.

9. The method according to claim 7, wherein the calculating of the material data comprises:
    determining an intensity data value for each of the detector solid angle regions, wherein the intensity data value represents an intensity of the portion of the particles, which are detected in the respective detector solid angle region;
    wherein the calculating of the material data is performed depending on at least one of a sum of the intensity data values and a difference between the intensity data values.

10. The method according to claim 1, further comprising:
    displaying a particle microscopic image of an object region of the object on a display;
    determining, depending on at least a portion of the material data, an image region of the particle microscopic image, which corresponds to a predefined material property of the interaction regions; and
    highlighting, in a visually recognizable manner, the determined image region on the display.

11. A particle beam microscope, comprising:
    a particle optical system, which is configured to scan at least one primary beam across a scanning region of a surface of an object;
    a detector system, which is configured to detect particles for a plurality of impingement locations of the primary beam within the scanning region;
    wherein the detected particles are released from an interaction region of the respective impingement location, wherein in each of the interaction regions, the primary beam interacts with the object;
    wherein the detector system is further configured to generate detector signals, which represent for each of the impingement locations an intensity of the detected particles;
    wherein the particle beam microscope further comprises a computing system, which is configured to calculate material data of at least a portion of the interaction regions depending on at least a portion of the detector signals and depending on topography data;
    wherein the topography data represent a topography of the object surface in at least a portion of the scanning region.

12. The particle beam microscope according to claim 11, wherein the computing system is further configured to calculate the topography data at least in part from the generated detector signals.

13. The particle beam microscope according to claim 11, wherein the detector system is configured to separately detect at least a portion of the particles in two separate detector solid angle regions.

14. The particle beam microscope according to claim 13, wherein the detector system is configured such that the detector signals comprise a solid angle detector signal for each of the detector solid angle region; and wherein the computing system is configured to generate the topography data depending on the solid angle detector signals.

15. The particle beam microscope according to claim 13, wherein the two detector solid angle regions are aligned with mirror symmetry about a first symmetry plane, in which an axis of the primary beam is located.

16. The particle beam microscope according to claim 13, wherein the computing system is configured:

to determine an intensity data value for each of the detector solid angle regions, wherein the intensity data value represents an intensity of the particles, which are detected in the respective detector solid angle region; and to determine the material data depending on at least one of a sum of the intensity data values and a difference between the intensity data values.

17. The particle beam microscope according to claim 11, wherein the detector system is configured to separately detect at least a portion of the particles in four mutually separated detector solid angle regions;

wherein a first pair of the detector solid angle regions is aligned with mirror symmetry about a first symmetry plane, in which an axis of the primary beam is located; and wherein a second pair of the detector solid angle regions is aligned with mirror symmetry about a second symmetry plane, in which the axis of the primary beam is located.

18. The particle beam microscope (1) according to claim 11, wherein the detected particles are a fraction of a plurality of emitted particles, wherein the plurality of the emitted particles are emitted from the interaction region into vacuum in all directions;

wherein the computing system is configured to determine an intensity of the emitted particles for each of the portion of the interaction regions;

wherein the calculating of the material data is performed depending on the determined intensities of the emitted particles.

19. The particle beam microscope according to claim 1, wherein the detector system is configured such that the detecting of the particles comprises selectively detecting primary particles.

20. The particle beam microscope according to claim 11, further comprising a display, wherein the computing system is further configured to:

display a particle microscopic image of an object region of the object on the display;

determine an image region of the particle microscopic image, which corresponds to a predefined material property of the interaction regions, depending on at least a portion of the material data; and highlighting, in a visually recognizable manner, the determined image region on the display.

21. The method according to claim 1, wherein the calculating of the material data comprises for each of the portion of interaction regions:

determining an intensity fraction of the intensity of the detected particles released from the respective interaction region, wherein the intensity fraction is generated by primary particles.

22. The particle beam microscope according to claim 11, wherein the computing system is configured such that for each of the portion of interaction regions in the calculating of the material data, an intensity fraction of the detected particles released from the respective interaction region is determined, wherein the intensity fraction is generated by primary particles.

23. The particle beam microscope according to claim 13, wherein the two detector solid angle regions are arranged in a diametrically opposed relationship relative to the axis of the primary beam.

* * * * *